United States Patent
Ashar et al.

Patent Number: 5,457,638
Date of Patent: Oct. 10, 1995

[54] TIMING ANALYSIS OF VLSI CIRCUITS

[75] Inventors: Pranav Ashar; Sharad Malik, both of Princeton, N.J.

[73] Assignees: NEC Research Institue, Inc.; Princeton University, both of Princeton, N.J.

[21] Appl. No.: 23,828

[22] Filed: Feb. 23, 1993

[51] Int. Cl.⁶ .................................................... G06F 17/50
[52] U.S. Cl. ......................... 364/490; 364/489; 364/488
[58] Field of Search ................................... 364/488, 489, 364/490, 491, 578

[56] References Cited

U.S. PATENT DOCUMENTS

| | | | |
|---|---|---|---|
| 4,924,430 | 5/1990 | Zasio et al. | 364/578 |
| 5,191,541 | 3/1993 | Landman et al. | 364/489 |
| 5,197,015 | 3/1993 | Hartoog et al. | 364/490 |
| 5,210,700 | 5/1993 | Tom | 364/489 |
| 5,218,551 | 6/1993 | Agrawal et al. | 364/491 |

OTHER PUBLICATIONS

"Automatic Synthesis and Technology Mapping of Combinational Logic" by R. A. Bergamaschi, IEEE 1988, pp. 466–469.

"Timing Optimization on Mapped Circuits" by Yoshikawa et al., IEEE 28th ACM/IEEE Design Automation Conf., 1991, pp. 112–117.

"Socrates: A System for Automatically Synthesizing and Optimizating Combinational Logic" by Gregory et al., IEEE 23rd Design Automation Conf., 1986, pp. 79–85.

"MIS: A Multiple–Level Logic Optimization System" by Brayton et al., IEEE Trans. Computer–Aided Design, vol. CAD–6, No. 6, Nov. 1987, pp. 1062–1081.

*Primary Examiner*—Vincent N. Trans
*Attorney, Agent, or Firm*—Arthur J. Torsiglieri

[57] ABSTRACT

A computer-implemented process for doing timing analysis of a VLSI sequential circuit that includes false paths. It includes the steps of transforming the circuit into a functionally equivalent $\delta$ path disjoint circuit for a given delay value and propagating all inverters to primary inputs of the circuit and performing a multifault test on all primary input fanouts of a particular length consisting solely either of all zoroes or of all ones.

1 Claim, 2 Drawing Sheets

TIMING ANALYSIS OF VLSI CIRCUITS

FIELD OF INVENTION

This invention relates to the computer-aided design (CAD) of very large scale integrated (VLSI) circuits and more particularly to functional timing analysis of such circuits as part of the design process.

BACKGROUND OF THE INVENTION

The size and complexity of state-of-the-art very large scale integrated circuits and testing has made it necessary that much of their design and testing be computer-implemented.

Logic synthesis has now become an integral part of the synthesis pipeline of VLSI designs. Algorithms for automatic design of logic, targeting circuit area, delay, testability and power dissipation are now available in most logic synthesis systems. Analysis tools play an integral part in design automation, both in their own right as well as pat of synthesis systems where they are used to evaluate the quality of the synthesized circuits. Timing analysis analyzes the temporal behavior of a circuit; it determines when event occur in a circuit. In a synchronous digital system timing analysis is used to determine the delay of the combinational part of the circuit. The delay of the combinational part is the time taken for the outputs of the combinational circuit to settle to their final value after the inputs have been applied. This delay in turn determines the minimum permissible clocking period of the synchronous circuit. This invention addresses the problem of accurately determining the delay of combinational logic circuits. It is important to know this delay so that the clocking period can be made as short as feasible.

It is familiar practice in a CAD process to represent a combinational logic circuit as a Directed Acyclic Graph (DAG) with the nodes in the DAG corresponding to gates, and the links corresponding to the wires between the gates. Each DAG node can be weighted by the delay of the corresponding gate. The method used to arrive at the node weights is termed the delay model. Delay models vary in the level of accuracy with which they reflect the true gate delay. The choice of the delay model is largely orthogonal to the problem solved by this invention. Hence, the solutions provided by this invention are independent of the delay model used.

Until recently, circuit delay was computed as the length of the topologically longest path in a weighted-DAG representation of the circuit. While this approach is computationally very simple, it tends to be grossly inaccurate (pessimistic) in most situations. The source of this inaccuracy is that in most circuits, the designed signal value propagates to the circuit output via multiple paths, either by design or as a side effect of the application of logic synthesis and high-level synthesis algorithms. A path that is one of the topologically longest paths, but is never the first path to propagate a value to the output for any input vector, cannot be responsible for the circuit delay. Delay estimation under this additional complication requires a functional timing analysis of the circuit. Functional timing analysis is timing analysis which takes into account only true paths.

While various conditions have been proposed for characterizing a path actually responsible for circuit delay (also known as a true path), it was only recently that a correct necessary and sufficient condition was proposed. This was in a paper entitled "Delay Computation in Combinational Circuits: Theory and Algorithms", by Devadas, Keutzer and Malik, in the Proceedings of the International Conference on Computer-Aided Design (November 1991). The application of this condition, one path at a time, is not generally feasible because of the large number of long paths in a typical circuit. It was the extension of this condition in the paper to characterize sets of paths responsible for circuit delay that made its use practical. In that paper, a relationship was established between the truth or falsity of the set of longest paths and the testability of an appropriate multiple fault in the Equivalent Normal Form (ENF) representation of the circuit. The ENF of a circuit is a two-level representation that represents the logic function computed by the multi-level circuit while retaining path information. Since the ENF is exponentially larger than the multi-level representation this technique cannot directly be used in practice. To overcome this, it was then shown how test generation for the multiple fault could be performed on the original circuit by taking into consideration timing information during test generation. This approach was called timed test generation, and the associated calculus was called timed D-calculus.

There are some drawbacks associated with timed test generation:

In particular, Automatic Test Pattern Generators (ATPG) cannot be used directly for timed test generation. Considerable modification has to be performed to the basic routines like backward/forward implication and backtrace in the ATPG. The specifics of the modifications are intertwined into the details of the ATPG algorithm, and are therefore non-trivial.

Additionally, timing information of each error value at the input of the gate needs to be taken into account while evaluating a fanout edge of the gate. This adds considerable complexity to error value propagation.

Moreover, unlike in conventional stuck-fault test generation, when an error value has to be propagated across a gate, the evaluation of each fanout edge has to be performed separately. Since an error value may have to be propagated across a gate a large number of times, in timed test generation considerable additional computation is required over conventional test generation.

Finally, the extension of times test generation to handle complex gates is non-trivial.

The invention provides a technique which is relatively free of these problems.

SUMMARY OF THE INVENTION

The present invention seeks to avoid the need for timed test generation in timing analysis of combinational logic circuits and its various complexities. In particular, the invention aims to permit the use simply of unmodified conventional Automatic Test Pattern Generation (ATPG) for functional timing analysis.

Basically, the invention involves transforming the circuit on which timing analysis is to be performed to a functionally equivalent circuit having the same number of levels of gates, such that timing analysis on the original circuit can be performed by performing unmodified conventional test pattern generation on the transformed circuit.

To this end, the invention involves first modifying for test purposes in the light of timing information, the original circuit into a transformed but functionally equivalent circuit in which all the paths beginning at a primary input fanout point are all either of length equal to or greater than δ, or all of length less than δ. Such a circuit is said to be δ path disjoint for the delay value δ.

Any circuit can be transformed to a functionally equivalent δ path disjoint circuit by a simple topological transformation, as will be discussed hereinafter. Then, additionally, the resulting circuit is modified further to propagate all inverters to primary inputs of the circuit. The, as the next step of the novel testing process there is performed a conventional multifault test on all primary input fanouts from which all paths have a length equal to or greater than δ. If no test is found, the value of δ is reduced by a unit time and the process repeated until a test is found.

The invention is based on our discovery that there exists a true path of length equal to or greater than δ if, and only if, there exists a test for a multiple fault consisting of all zeroes or all ones on the first wires of the paths of length equal to or greater than δ in the transformed circuit. In particular, we find it unnecessary to see if there exists a test for multiple faults including both some ones and some zeroes on the first wires of paths length equal to or greater than δ in the transformed circuit. Since in complex circuits there generally are many paths that need testing, this factor results in considerable simplification and makes practical a technique that might otherwise usually be impractical.

DETAILED DESCRIPTION

It will be helpful to the understanding of the invention first to discuss the following material on false paths.

Informally, a path is an alternating sequence of gates and edges in a circuit. False paths in combinational logic circuits have been studied extensively in recent years. These paths are never exercised during the operation of the circuit due to the logical functionality and delay values of the circuit components.

Figure 1:
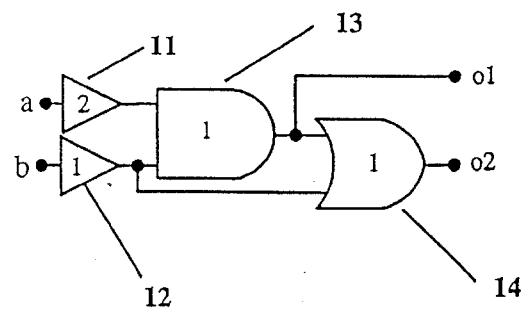
FIG. 1 shows in schematic form a circuit that will be used in the discussion as an example of a circuit that includes a false path.

The exemplary circuit in FIG. 1 will serve to illustrate the notion of false paths as well as their removal in combinational circuits. As shown, the circuit 10 includes a pair of buffers 11 and 12 whose inputs are supplied via terminals a and b, respectively and whose outputs are supplied to the two input terminals of AND gate 13. The output of buffer 12 is also applied to one input of OR gate 14 whose other input is supplied by the output of the AND date 13. The two output terminals 01 and 02 are connected to the outputs of the AND fate 13 and OR gate 14, respectively. The integers inside the gates in this circuit represent the delays of the gates. We will consider the floating mode operation of the circuit. In this mode, the state of the circuit is considered to be unknown when a given input vector is applied. This is a pessimistic assumption; it does not underestimate the length of the longest true path. In addition, we allow for monotone speedup, i.e. the analysis remains valid even when one or more gates in the circuit speed up to switch faster than their specified delay values. In this context a path is false when for each primary input vector v one of the following two things happens:

1. At the inputs to some gate along the path in question, the signal value on the path presents a non-controlling value while an off-path signal (also referred to as a side-input) presents a controlling value. Thus, the off-path signal controls the output. A controlling value for a gate is a value that determines the output value for a gate independent of the other inputs to a gate, for example 0 for an AND gate. A non-controlling value cannot determine the output value by itself, for example, 1 for an AND gate.

2. Both the on-path signal and the off-path signal present controlling values, but the off-path signal presents the controlling value first (this is referred to as an early input), thereby determining the output of the gate.

FIG. 1 illustrates both these conditions. Consider the path of length 4 from a to o2. Consider all possible assignments to a and b.

--- a = 0, b = 0: Condition 2 occurs at the AND gate.
a = 0, b = 1: Condition 1 occurs at the OR gate.
a = 1, b = 0: Condition 1 occurs at the AND gate.
a = 1, b = 1: Condition 2 occurs at the OR gate.

---

Thus, this path is false.

It can be shown that if all paths of length greater than δ are false in a circuit, then these paths can be removed from the circuit while preserving its logical functionality and guaranteeing that its true delay does not increase. This invention is not particularly concerned with the removal of false paths. The sole purpose of introducing this discussion is to introduce the notion of δ path disjoint circuits.

The following characterization of true paths was previously developed. For a path π to be true, it is necessary and sufficient that there exist an input vector such that for every gate g along the π, 1. if all inputs to g have a non-controlling value, then π is the last one to present the non-controlling value, or
2. if there is even one controlling value at the inputs to g, then π is the first one to provide the controlling value.

Figure 2:
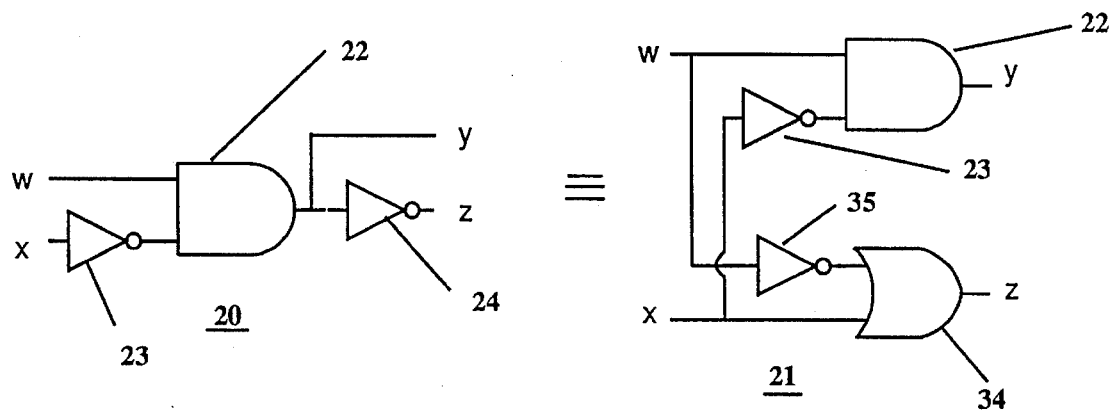
FIG. 2 illustrates how an inverter in an output may be pushed to a primary input, a technique used in the invention.

It is also important to understand what is meant by timed-test generation, and this concept will be described with reference to an original circuit 20 and its functionally equivalent, transformed version 21, both shown in FIG. 2. Circuit 20 includes the AND gate 22, one input of which is supplied via input terminal w and the other via input terminal x by way of the inverter 23. The output of the AND gate 22 is supplied directly to output terminal y and by way of inverter 24 to the output terminal z.

Timed-test generation is used to answer the question: Is there a single path of length at least δ that is true? This question normally is answered separately for the rising and falling delays. We consider only the rising delay, the falling delay can be handled similarly.

We will demonstrate timed test generation on a transformed circuit 21 obtained from the original circuit 20 as follows: circuit 21 is obtained from circuit 20 by migrating all inverters to the primary inputs. The inverter at the output of a gate may be moved to the input by using DeMorgan's laws of complementation. Thus, all the inverters may be moved to the primary inputs starting at the primary outputs and recursively applying this procedure to all gates in the circuit. Moreover, a gate that is used in both inverting and non-inverting phase may need to be duplicated. As seen in FIG. 2, the circuit portion involving output z needs to be transformed. In particular, now the input terminal x directly supplies one input to OR gate 34 and the input terminal w supplies the other input terminal of gate 34 by way of the inverter 35. The portion of circuit 20 involving output y remains as before so the same reference numerals are maintained. Since each gate is duplicated no more than once, 21 is at most twice the size of 20. The sensitization conditions on paths in 21 are the same as those for the corresponding paths in 20. It is to be understood that 21 is being used only for purpose of exposition and, as will be shown later, timed test generation may be done directly on 20 without need for constructing 21.

For each edge i in 21 we determine $max'(e_i)$, which is the length of the longest path starting at the source of edge i and ending at some sink of the circuit DAG, i.e. at some primary output.

There is at least one true path of length at least $\delta$ in the circuit, if and only if, (iff() the multifault $\{e_i$ stuck—at—$0\}$ can be tested using timed test generation. Here $e_i$ is the fanout edge of a primary input (after any possible inverters) for which $max'(e_i) \geq \delta$. The goal of test generation is to propagate a D to the output of the circuit along only paths of length at least $\delta$. For each D that we are trying to propagate forward through the circuit there is an associated value D.s, which captures the timing information associated with the error value. The semantics of D.s will be described shortly, at this point it is sufficient to note that for each D placed on the fanout edges of the primary inputs, D.s=0.

There is a difference in the testing of this multifault and classical stuck-at-fault testing in terms of how a fault effect is propagated through a gate. We now examine this difference.

Evaluation of the output of a gate, g, given its inputs, is done in a manner similar to the standard D-calculus with two differences. The first is that the evaluation for each fanout edge, $e_i$, of g is done separately. Thus, the different fanout edges may evaluate to different values. The second is that the timing information of each error value E (D or $\bar{D}$), i.e. E.s is taken into account while evaluating the value for $e_i$.

The following cases describe the evaluation of the value on $e_i$, given the values on the inputs to g for some input vector v.

1. There is a controlling value at the input of g: This forces $e_i$ to the corresponding controlled value.

2. Each input of g has a non-controlling value on it: $e_i$ takes on the non-controlled value.

3. Some set of inputs have an error value on them, some (possibly none) have non-controlling values: Note that D and $\bar{D}$ cannot be present on the inputs of g since we only propagate either D's or $\bar{D}$'s at a time, but not both. Let $E_k$ be the error values on the inputs and d(g) be the delay of gate g. Let s be as given by the following table:

| E | gate | s |
| --- | --- | --- |
| D | or | $min (E_k \cdot s)$ |
| D | and | $max (E_k \cdot s)$ |
| $\bar{D}$ | or | $max (E_k \cdot s)$ |
| $\bar{D}$ | and | $min (E_k \cdot s)$ |

(a) If $s+d(g)+max'(e_i) \geq \delta$, then $e_i$ evaluates to the error value E with E.s=s.

(b) If $s+d(g)+max'(e_i) < \delta$, then $e_i$ evaluates to the error free value, i.e., 1 for a D and 0 for a $\bar{D}$.

Timed test generation can be applied directly on C without needing to generate C' by doing some additional bookkeeping that keeps track of the parity of inversions seen by the error value in the circuit but these are not being discussed in detail herein.

The invention is a confluence of the results on the characterization of sets of true/false paths in the manner described in the previously identified paper of Devadas, Keutzer and Malik, and results on the removal of false paths. An efficient algorithm for minimally transforming a circuit in order to remove long false paths was provided in a paper by A. Saladanha, R. K. Brayton, and A. Sangiovanni-Vincentelli entitled "Circuit structure relations to redundancy and delay: The KMS algorithm revisited." In The Proceedings of the Design Automation Conference, pages 245–252, June 1992. Our invention is the discovery that the same transformation, in conjunction with a test pattern generator for stuck faults, can be used for functional timing analysis. The motivation for this approach is from the results on the characterization of sets of true/false paths in the paper of Devadas, Keutzer and Malik.

We will now describe in detail our novel method for true-delay computation. The goal of the method is to find the true delay of the circuit. It begins with some assumed delay value $\delta$, either provided by the user, or obtained by computing the length of the topologically longest path in the circuit. For computer implementation the circuit diagrams in its synthesized form is transferred to a computer format by any of the techniques known for such purposes, such as BLIF (Berkeley Logic Interface Format) and then stored in this format in the computer that is to do the timing analysis.

The method basically operates in two steps. In the first step, given the input circuit C and a delay value of $\delta$, C is transformed by a computer into the circuit $C^\delta$. $C^\delta$ satisfies the following property: Given a gate G in $C^\delta$, the set of all paths, $\Pi = \{\pi_i\}$, from the primary inputs of $C^\delta$ to the output of G, and the set of all paths $\Gamma = \{\gamma_j\}$, from the output of G to primary outputs of $C^\delta$. The path, $\pi_i \gamma_j$, corresponds to the concatenation of the paths $\pi_i$ and $\gamma_j$. Therefore, a path $\pi_i \gamma_j$, $\pi_i \in \Pi$ and $\gamma_j \in \Gamma$, is a path from a primary input to a primary output. For each $\pi_i \in \Pi$, consider the set of paths, $S_{\pi_i} \{\gamma_j, \gamma_j \in \Gamma\}$, formed by concatenating the chosen value of $\pi_i$ with all the paths in $\Gamma$. $C^\delta$ satisfies the property that for each $S_{\pi_i}$, there is no pair of paths in $S_{\pi_i}$ such that one of the paths in the pair is of length $\geq \delta$ and the other path in the pair is $< \delta$. A circuit satisfying this property is called an $\delta$ path disjoint circuit in the Saldanha, Brayton and Sanvioganni-Vincentelli paper mentioned earlier. An efficient algorithm for making a circuit $\delta$ path disjoint was given in such paper. The same algorithm advantageously is used in the invention. A detailed description of the algorithm is provided later. In addition to being $\delta$ path disjoint, $C^\delta$ also satisfies the property that all inverters have been pushed to the primary inputs. The first step of the algorithm returns a set (called $\delta$_leaves) of wires in $C^\delta$ which correspond to the first edges of all the paths of length $\geq \delta$. If a primary input is used by a path in the inverted phase, the corresponding wire in $\delta$_leaves is the inverter output, otherwise it is the fanout point of a primary input. There is no inversion between a wire in $\delta$_leaves and any primary output.

In practice, there is a small area penalty associated with making the circuit $\delta$ path disjoint. In addition, pushing the inverters can cause some gates in the circuit to be duplicated. However the increase in the size in $C^\delta$ is manageable.

In the second step of the method, a multiple stuck-at fault $(m_1)$, consisting of the wires in $\delta$_leaves stuck-at one, is injected on the wires in $\delta$_leaves and test generation is attempted for it. If the fault is found to be redundant, test generation is attempted for a second multiple fault $(m_2)$ obtained by inverting the polarities of all the single faults contained in $m_1$. If $m_2$ is also redundant, then we conclude that the delay of the circuit is $<\delta$. Both the steps above are now repeated for a lower value of $\delta$. The algorithm stops when a test is found for either $m_1$ or $m_2$.

Note that the test generation part of the method (i.e. the part of the method which does a functional analysis of the circuit) is completely decoupled from the timing-dependent part of the method. This fact makes it possible to use unmodified conventional ATPG in our timing analysis algorithm.

C-like pseudo code for the method is given below:

```
compute-true-delay(C)
{
    /* Computes the length of the topologically longest path */
    δ = delay-trace(C);
    found_true_delay = FALSE;
    do {
        δ_leaves = { }
        C^δ = transform-ckt-for-delay-estimation(C, δ, δ_leaves) ;
        fault_list = { } ;
        foreach_wire wire in δ_leaves {
            fault_list = fault_list ∪ wire stuck-at 1 ;
        }
        fault_status = do-atpg(C^δ, fault_list) ;
        if (fault_status == TESTED) {
            found_true_delay = TRUE ;
            continue ;
        }   fault_list = { } ;
        foreach_wire wire in δ_leaves {
            fault_list = fault_list ∪ wire stuck-at 0 ;
        }
        fault_status = do-atpg(C^δ, fault_list) ;
        if (fault_status == TESTED) {
            found_true_delay = TRUE ;
        } else {
            δ = δ - decrement ;
        }
    } while (!found_true_delay) ;
    /* Delay of C is δ */
    return(δ) ;
}
transform-ckt-for-delay-estimation(C, δ, δ_leaves)
{   C^(path disjoint) = make-ckt-δ-path-disjoint(C, δ) ;
    C^δ = push-inverters-along-long-paths-to-primary-inputs
        (C^(δ path disjoint), δ) ;
    get-first-wires-on-long-paths(C^δ, δ_leaves) ;
    return(C^δ) ;
}
make-ckt-δ-path-disjoint(C, δ)
{
    C^(δ path disjoint) = C ;
    /* For each gate g, compute the set of all path lengths a_g to
       the output of g. */
    gate_list = list of all gates ordered from inputs of
        C^(δpath disjoint) to its outputs;
    foreach_gate g in gate_list }
        if (g is a primary input) {
            a_g = arrival time at input g ;
        } else {
            a_g = { } ;
            foreach_fanin fanin of gate g {
                /* d_ij is the delay from the output of gate i to the
                   output of gate j */
                a_g = a_g ∪ {t + d_fanin^g | t ∈ a_fanin} ;
            }
        }
    }
    gate_list = list of all gates ordered from outputs of
        C^(δ path disjoints) to its inputs ;
    /* For each gate g, compute the set of all path lengths e_g
       from the output of g to the circuit outputs. */
    foreach_gate g in gate_list {
        e_g = { } ;
        foreach_fanout fanout of gate g {
            if (fanout is a primary output) {
                e_g = e_g ∪ {0} ;
            } else {
                e_g = e_g ∪ {t + d_g^fanout | t ∈ e_fanout} ;
            }
        }
    }
    /* Now, duplicate gates so that the parts of the paths longer
       then δ will not have any fanout */
    foreach_gate g in gate_list {
        foreach_time t in ascending order in a_g {
            if (t + min(e_g) ≤ δ && t + max(e_g)> δ) {
                /* Gate g must be duplicated. */
                g' = duplicate_gate(g) ;
                a_g' = a_g ;
                e_g' = e_g - {t_c | t_c ∈ e_g, t + t_c ≤ δ} ;
                e_g = e_g - {t_c | t_c ∈ e_g, t + t_c > δ} ;
                /* Now distribute the fanout */
                foreach_fanout fanout of gate g {
                    if (t + min(e_fanout) + d_g^fanout > δ) {
                        replace connection from g to fanout by
                            g' to fanout ;
                    }
                }
            }
        }
    }
    return(C^(δ path disjoint)) ;
}
```

Figure 3:
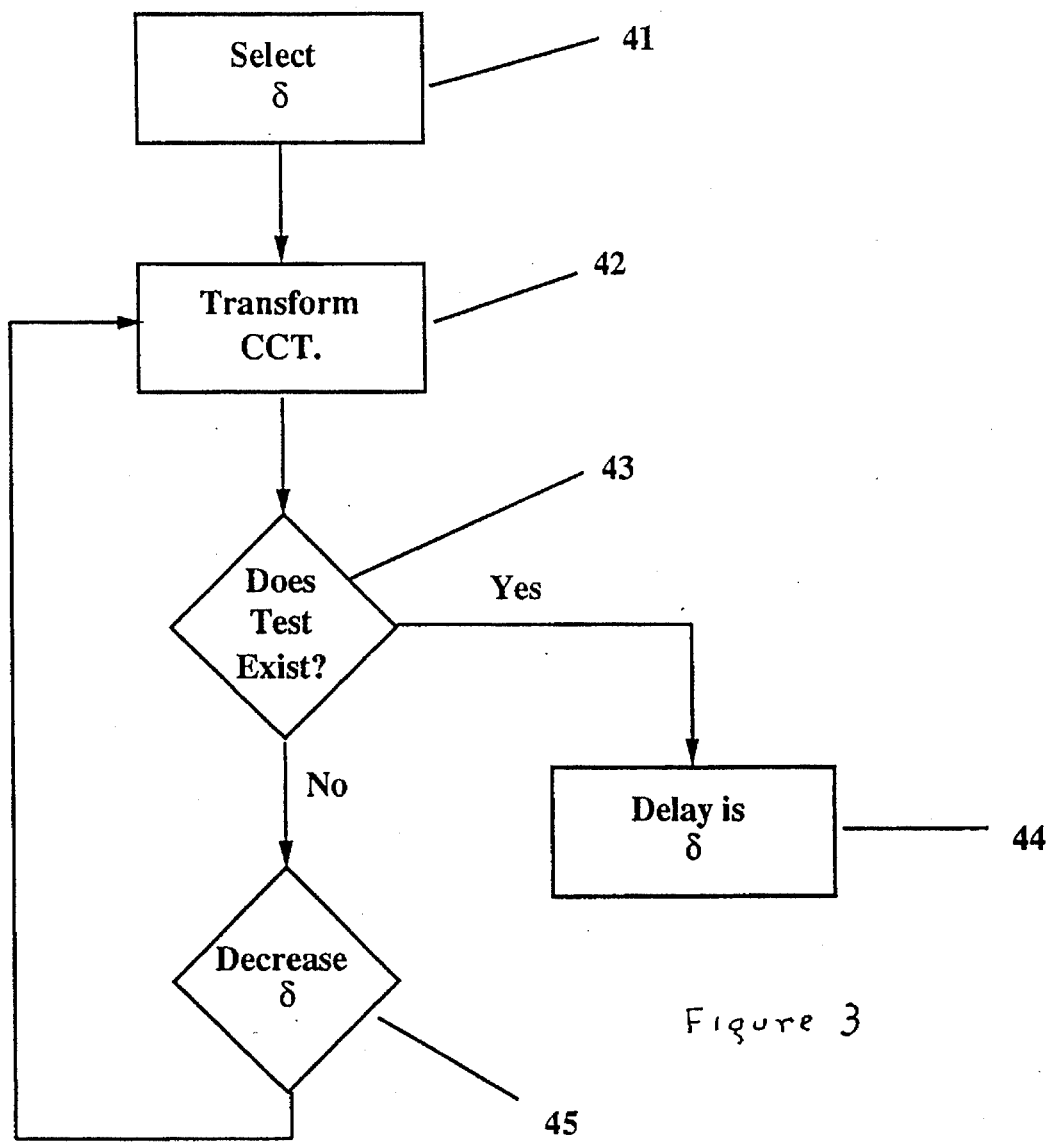
FIG. 3 is a flow chart of the basic steps of the process of the invention.

FIG. 3 depicts the basic steps of the method in flow chart form. As shown, step 41 involves an initial selection f a suitable δ as a starting point. Normally, the computer would select for this value the delay of the longest path in the circuit under test, using any standard known process for determining such value. Then the computer would transform the original circuit to the modified form appropriate for the value of δ chosen following the rules discussed, as indicated by step 42. This is followed by the multifault testing described to see if a valid test exists for the particular value of δ, shown as step 43. If a valid test is found, the delay of the original circuit is δ as indicated by step 44. If no valid test is found the value of δ is decremented in step 45 by some amount, and the new value of δ is fed back to step 42 for use in a new transformation of the circuit in view of the new value of δ, and steps 43 and 45 repeated until δ has been reduced sufficiently that a valid test is found and a final δ is determined.

What is claimed is:

1. A computer-implemented process for functional timing analysis of a combinational integrated circuit in which there are at least several topologically longest paths comprising the steps of a) first estimating the delay δ of the topologically longest path in a weighted acyclic graph of said circuit, b) transforming said circuit into a functionally equivalent δ path disjoint circuit for the delay value δ, and propagating all the inverters in the circuit to the primary inputs of the circuit, c) performing a multifault test on all primary input fanout points of paths beginning at an input fanout point of length equal to or greater than δ, said multifault test consisting only of all zones or all ones on the said fanouts, and d) if a test is found, treating δ as the delay of the circuit, but if a test is not found, decreasing the values of δ by a unit delay and repeating steps b, c, and d of the process with the decreased values of δ until a test is found.

* * * * *